United States Patent
Kotani et al.

(10) Patent No.: US 7,925,090 B2
(45) Date of Patent: Apr. 12, 2011

(54) METHOD OF DETERMINING PHOTO MASK, METHOD OF MANUFACTURING SEMICONDUCTOR DEVICE, AND COMPUTER PROGRAM PRODUCT

(75) Inventors: Toshiya Kotani, Machida (JP); Kazuya Fukuhara, Tokyo (JP); Kyoko Izuha, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1121 days.

(21) Appl. No.: 11/601,797

(22) Filed: Nov. 20, 2006

(65) Prior Publication Data

US 2007/0130560 A1  Jun. 7, 2007

(30) Foreign Application Priority Data

Nov. 21, 2005 (JP) ................................. 2005-336183

(51) Int. Cl.
*G06K 9/34* (2006.01)
(52) U.S. Cl. .......................... 382/181; 382/238; 382/283
(58) Field of Classification Search .................. 382/181, 382/238, 283, 144, 141; 716/19; 348/86
See application file for complete search history.

(56) References Cited

U.S. PATENT DOCUMENTS

| | | | | |
|---|---|---|---|---|
| 4,272,756 A * | 6/1981 | Kakumoto et al. | ............ | 382/284 |
| 4,641,353 A * | 2/1987 | Kobayashi | ..................... | 382/144 |
| 4,668,089 A * | 5/1987 | Oshida et al. | ............ | 356/139.07 |
| 4,669,123 A * | 5/1987 | Kobayashi et al. | ........... | 382/144 |
| 4,828,392 A * | 5/1989 | Nomura et al. | ............... | 356/401 |
| 4,992,889 A * | 2/1991 | Yamagami et al. | ............ | 382/238 |
| 5,448,494 A * | 9/1995 | Kobayashi et al. | ............... | 716/5 |
| 6,272,236 B1 * | 8/2001 | Pierrat et al. | ................... | 382/144 |
| 6,741,334 B2 * | 5/2004 | Asano et al. | ..................... | 355/77 |
| 6,990,225 B2 * | 1/2006 | Tanaka et al. | ................. | 382/144 |
| 6,993,184 B2 * | 1/2006 | Matsugu | ....................... | 382/173 |
| 7,383,530 B2 * | 6/2008 | Wang et al. | ..................... | 716/21 |
| 2002/0164064 A1 * | 11/2002 | Karklin et al. | ............... | 382/145 |
| 2005/0008947 A1 | 1/2005 | Akiyama | | |
| 2005/0089768 A1 * | 4/2005 | Tanaka et al. | ..................... | 430/5 |
| 2005/0188341 A1 | 8/2005 | Fukuhara et al. | | |
| 2005/0190957 A1 * | 9/2005 | Cai et al. | ....................... | 382/141 |

FOREIGN PATENT DOCUMENTS

JP  9-319067  12/1997

(Continued)

OTHER PUBLICATIONS

Notice of Reasons for Rejection mailed Dec. 7, 2010, in corresponding Japanese Patent Application No. 2005-336183, and English language translation thereof.

*Primary Examiner* — Daniel G Mariam
*Assistant Examiner* — Aklilu K Woldemariam
(74) *Attorney, Agent, or Firm* — Finnegan, Henderson, Farabow, Garrett & Dunner, L.L.P.

(57) ABSTRACT

A method of determining a photo mask, includes specifying a mask pattern for a photo mask for a first exposure apparatus, specifying a plurality of exposure conditions allowed to be set for a second exposure apparatus, predicting a projection image of the mask pattern to be projected on a substrate by the second exposure apparatus, for each of the exposure conditions, predicting a processed pattern to be formed on a substrate surface on the basis of the projection image, for each of the exposure conditions, determining whether or not the processed pattern meets a predetermined condition for each of the exposure conditions, and determining that the photo mask is applicable to the second exposure apparatus if the processed pattern meets the predetermined condition for at least one of the exposure conditions.

14 Claims, 2 Drawing Sheets

FOREIGN PATENT DOCUMENTS

| | | |
|---|---|---|
| JP | 2002-132986 | 5/2002 |
| JP | 2002-190443 | 7/2002 |
| JP | 2002-328462 | 11/2002 |
| JP | 2004-79586 | 3/2004 |
| JP | 2005-217430 | 8/2005 |
| JP | 2007-535135 | 11/2007 |

* cited by examiner

METHOD OF DETERMINING PHOTO MASK, METHOD OF MANUFACTURING SEMICONDUCTOR DEVICE, AND COMPUTER PROGRAM PRODUCT

CROSS-REFERENCE TO RELATED APPLICATIONS

This application is based upon and claims the benefit of priority from prior Japanese Patent Application No. 2005-336183, filed Nov. 21, 2005, the entire contents of which are incorporated herein by reference.

BACKGROUND OF THE INVENTION

1. Field of the Invention

The present invention relates to a method of determining a photo mask, a method of manufacturing a semiconductor device, and a computer program product.

2. Description of the Related Art

With the reduced sizes and increased integration levels of semiconductor devices, it has been more and more important to accurately form patterns with desired sizes. However, with pattern miniaturization, an optical proximity effect (OPE) prevents patterns with desired shapes from being faithfully formed. Thus, for actual photo masks, optical proximity correction (OPC) is performed on the mask patterns so as to obtain patterns with desired shapes (see, for example, Jpn. Pat. Appln. KOKAI Publication No. 9-319067).

The optical proximity effect generally depends on the characteristics of an exposure apparatus. This varies the optical proximity effect among exposure apparatuses. Thus, a photo mask subjected to appropriate optical proximity corrections for a certain exposure apparatus may fail to provide a pattern with a desired shape for a different exposure apparatus. To obtain a pattern with the desired shape, it is necessary to newly produce a photo mask subjected to optical proximity correction suitable for the different exposure apparatus. However, production of a new photo mask extends a manufacture period. Adjustment of an exposure parameter (for example, illumination shape) for the different exposure apparatus enables proper exposure to be achieved without producing a new photo mask. That is, provided that the adjustment of the exposure parameter results in a pattern meeting a predetermined condition, a new photo mask need not be produced even if the exposure apparatus is changed.

However, the adjustment of the exposure parameter is limited and thus does not always result in a pattern meeting the predetermined condition. If the adjustment of the exposure parameter does not result in a pattern meeting the predetermined condition, then a new photo mask must be produced. An operation for adjusting the exposure parameter is performed through a trial and error process at a manufacture site such as a factory. If the adjustment operation does not result in a pattern meeting the predetermined condition, the time spent in the adjustment operation will be wasteful. This further extends the manufacture period.

Thus, two measures, production of a new photo mask and adjustment of the exposure parameter, are possible if the exposure apparatus is changed. However, the lack of definite criteria for determining which measure to take results in extension of the manufacture period. It is therefore important to make an early and appropriate determination for measures to be taken if the exposure apparatus is changed.

BRIEF SUMMARY OF THE INVENTION

A first aspect of the present invention, there is provided a method of determining a photo mask, comprising: specifying a mask pattern for a photo mask for a first exposure apparatus; specifying a plurality of exposure conditions allowed to be set for a second exposure apparatus; predicting a projection image of the mask pattern to be projected on a substrate by the second exposure apparatus, for each of the exposure conditions; predicting a processed pattern to be formed on a substrate surface on the basis of the projection image, for each of the exposure conditions; determining whether or not the processed pattern meets a predetermined condition for each of the exposure conditions; and determining that the photo mask is applicable to the second exposure apparatus if the processed pattern meets the predetermined condition for at least one of the exposure conditions.

A second aspect of the present invention, there is provided a method of manufacturing a semiconductor device, comprising: specifying a mask pattern for a photo mask for a first exposure apparatus; specifying a plurality of exposure conditions allowed to be set for a second exposure apparatus; predicting a projection image of the mask pattern to be projected on a substrate by the second exposure apparatus, for each of the exposure conditions; predicting a processed pattern to be formed on a substrate surface on the basis of the projection image, for each of the exposure conditions; determining whether or not the processed pattern meets a predetermined condition for each of the exposure conditions; determining that the photo mask is applicable to the second exposure apparatus if the processed pattern meets the predetermined condition for at least one of the exposure conditions; and allowing the second exposure apparatus to project the mask pattern of the photo mask on a substrate, on the basis of the determination that the photo mask is applicable to the second exposure apparatus.

A third aspect of the present invention, there is provided a method of manufacturing a semiconductor device, comprising: specifying a mask pattern for a photo mask for a first exposure apparatus; specifying a plurality of exposure conditions allowed to be set for a second exposure apparatus; predicting a projection image of the mask pattern to be projected on a substrate by the second exposure apparatus, for each of the exposure conditions; predicting a processed pattern to be formed on a substrate surface on the basis of the projection image, for each of the exposure conditions; determining whether or not the processed pattern meets a predetermined condition for each of the exposure conditions; determining that the photo mask is applicable to the second exposure apparatus if the processed pattern meets the predetermined condition for at least one of the exposure conditions; determining that the photo mask is inapplicable to the second exposure apparatus if the processed pattern does not meet the predetermined condition for any of the exposure conditions; producing a new photo mask on the basis of the determination that the photo mask is inapplicable to the second exposure apparatus; and allowing the second exposure apparatus to project a mask pattern of the new photo mask on a substrate.

A fourth aspect of the present invention, there is provided a computer program product configured to store program instructions for execution on a computer, the program instructions causing the computer to perform: specifying a mask pattern for a photo mask for a first exposure apparatus; specifying a plurality of exposure conditions allowed to be set for a second exposure apparatus; predicting a projection image of the mask pattern to be projected on a substrate by the second exposure apparatus, for each of the exposure conditions; predicting a processed pattern to be formed on a substrate surface on the basis of the projection image, for each of the exposure conditions; determining whether or not the processed pattern meets a predetermined condition for each of the exposure conditions; and determining that the photo mask is applicable to the second exposure apparatus if the processed pattern meets the predetermined condition for at least one of the exposure conditions.

DETAILED DESCRIPTION OF THE INVENTION

An embodiment of the present invention will be described with reference to the drawings.

Figure 1:
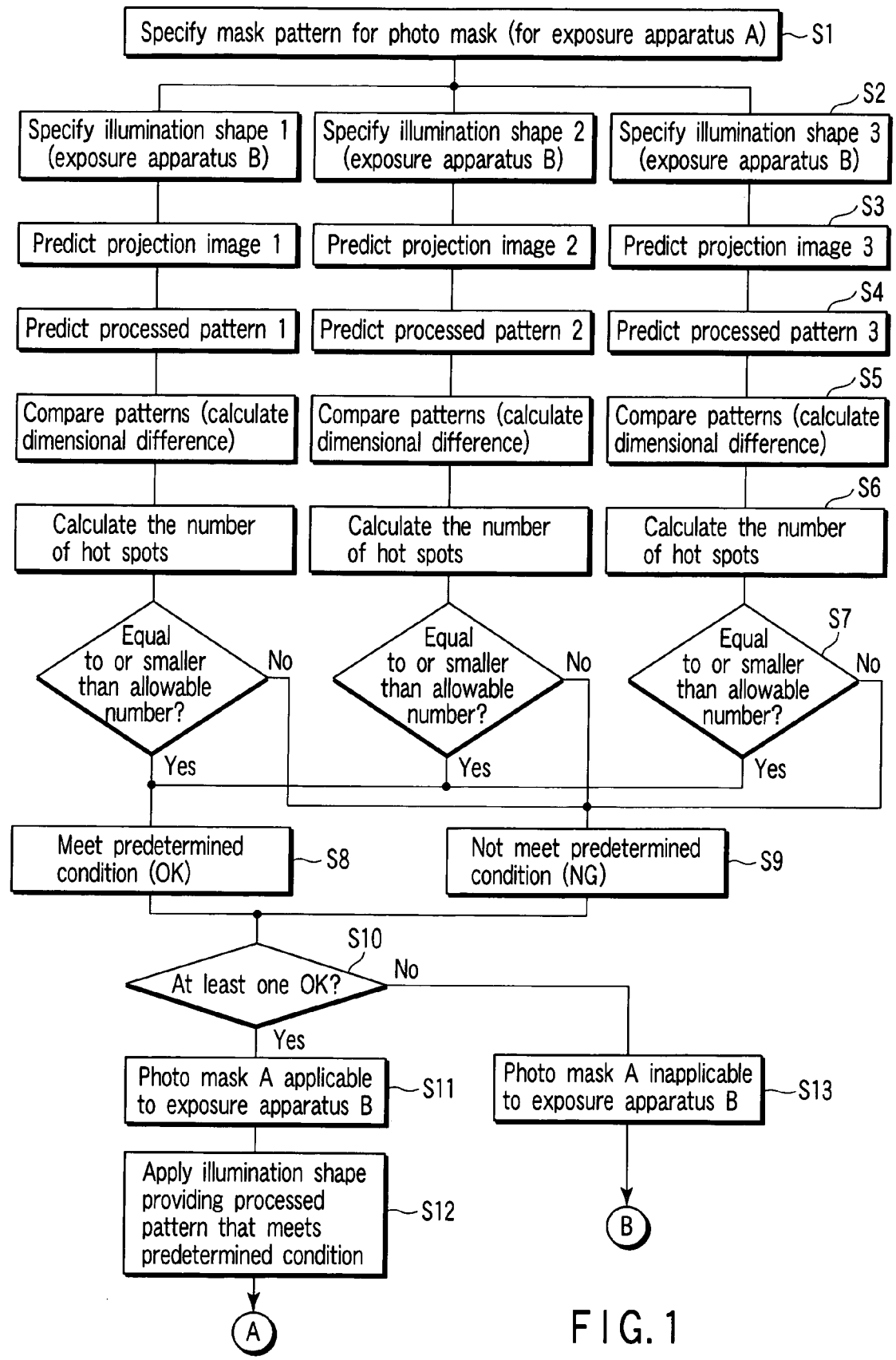
FIG. 1 is a flowchart showing a method according to an embodiment of the present invention.
Figure 2:
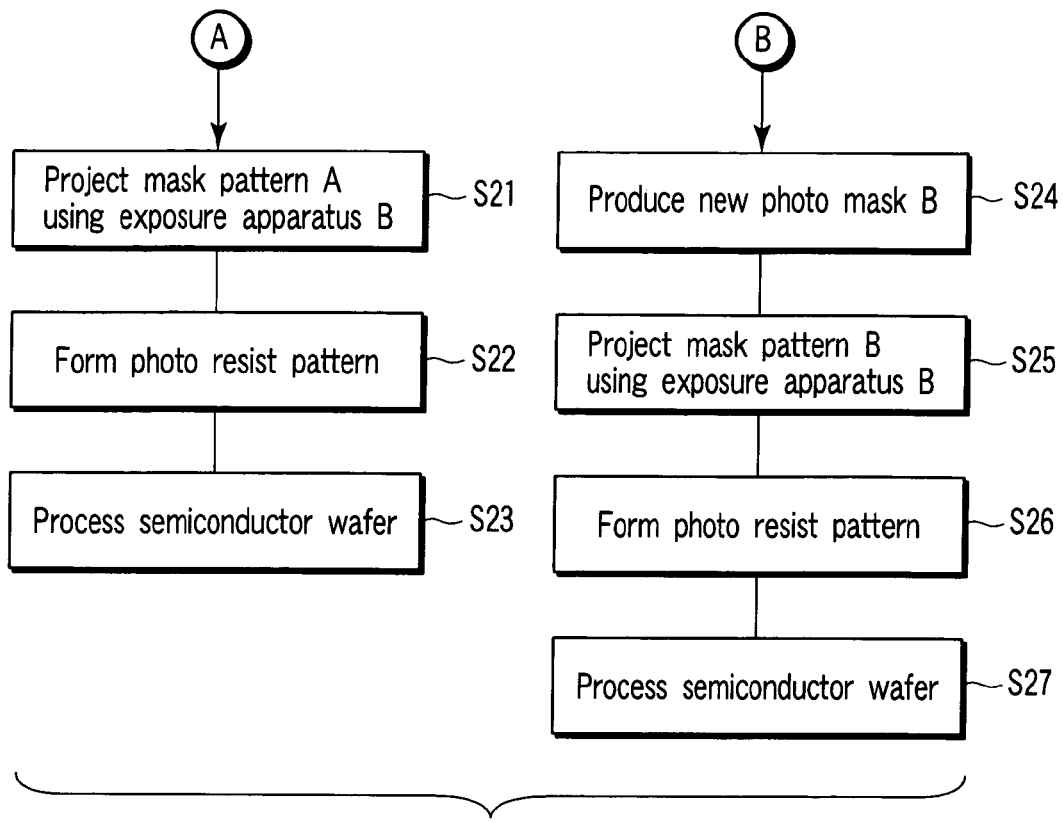
FIG. 2 is a flowchart showing the method according to the embodiment of the present invention.

FIGS. 1 and 2 are flowcharts showing a method according to an embodiment of the present invention.

First, the mask pattern (mask pattern A) of a photo mask A produced for one exposure apparatus (exposure apparatus A) is specified in a simulation tool in order to determine through simulation whether or not the photo mask A can be used for another exposure apparatus (exposure apparatus B) (S1). The mask pattern A of the photo mask A has been subjected to optical proximity correction suitable for the exposure apparatus A.

Then, a plurality of exposure conditions that can be set for the exposure apparatus B are specified in the simulation tool. For example, the illumination shape (in this case, illumination shapes 1 to 3) of the exposure apparatus B is used as the exposure condition (exposure parameter) (S2). The exposure apparatus comprises a variable α mechanism that enables the size of illumination to be physically adjusted. Accordingly, the plurality of illumination shapes are specified within the possible range of adjustments performed by the variable α mechanism of the exposure apparatus B. The illumination shape corresponds to the distribution of intensity of illumination light and can be expressed by, for example, an illumination position and a light intensity.

Then, a projection image (optical image) of the mask pattern A, to be projected on a substrate by the exposure apparatus B, is predicted for each of the plurality of exposure conditions (illumination shapes) (S3). Specifically, projection images (projection images 1 to 3) of the mask pattern A are calculated for the respective illumination shapes using data on the mask pattern A, specified in step S1, and data on the illumination shapes of the exposure apparatus B, specified in step S2. The substrate on which the mask pattern A is projected is assumed to be a semiconductor wafer on which a photo resist is formed.

Then, the processed pattern of the substrate surface based on the projection image is predicted for each of the plurality of exposure conditions (illumination shapes) (S4). Specifically, data on the projection image is used to calculate the predicted shape of a photo resist pattern to be formed on the semiconductor wafer.

Then, each of the calculated processed patterns (photo resist patterns) is compared with a reference pattern (S5). A design pattern (pattern not subjected to any optical proximity coercions) for the mask pattern A is used as the reference pattern. Specifically, the difference in dimensions between each of the processed patterns (processed patterns 1 to 3) and the design pattern is calculated for the entire area of the design pattern.

Then, on the basis of the comparison in step S5, the number of hot spots where the above dimensional difference is larger than an allowable dimensional difference is calculated for each processed pattern (S6).

Then, to determine whether or not the processed pattern meets the predetermined condition, a determination is made, for each processed pattern, of whether or not the number of hot spots is equal to or smaller than the allowable number (S7).

The processed pattern for which the number of hot spots is equal to or smaller than the allowable number is determined to meet the predetermined condition (S8). The processed pattern for which the number of hot spots is larger than the allowable number is determined not to meet the predetermined condition (S9). Further, a determination is made of whether or not at least one processed pattern meets the predetermined condition (S10).

If at least one processed pattern meets the predetermined condition, the photo mask A is determined to be applicable to the exposure apparatus B (S11). Moreover, the illumination shape providing the processed pattern that meets the predetermined condition is determined to be applicable to the exposure apparatus B (S12). If no processed patterns meet the predetermined condition, the photo mask A is determined to be inapplicable to the exposure apparatus B (S13).

As described above, a determination is made, through simulation, of whether or not the photo mask A produced for one exposure apparatus (exposure apparatus A) is applicable to another (exposure apparatus B). The illumination shape applicable to the exposure apparatus B is also determined through simulation.

If the photo mask A is determined to be applicable to the exposure apparatus B, then on the basis of this determination, it is used to execute an exposure process. Specifically, the mask pattern A of the photo mask A is actually projected on the substrate (semiconductor wafer on which a photo resist has been formed) by the exposure apparatus B (S21). Further, development is performed to form a photo resist pattern (S22), which is then used as a mask to process the semiconductor wafer (S23). The processing of the semiconductor wafer includes etching of a conductive film or an insulating film formed on the semiconductor wafer.

If the photo mask A is determined to be inapplicable to the exposure apparatus B, then on the basis of this determination, a new photo mask (photo mask B) applicable to the exposure apparatus B is produced (S24). The mask pattern B of the photo mask B produced is actually projected on the substrate (semiconductor wafer on which a photo resist has been formed) by the exposure apparatus B (S25). Further, development is performed to form a photo resist pattern (S26), which is then used as a mask to process the semiconductor wafer (S27). The processing of the semiconductor wafer includes etching of a conductive film or an insulating film formed on the semiconductor wafer as already described.

To produce a new photo mask B, the design pattern of the photo mask A is modified or the mask pattern of the photo mask A is modified. In either case, it is important to modify the pattern so as to minimize the number of hot spots when the modified photo mask is applied to the exposure apparatus B.

Figures 3, 4:
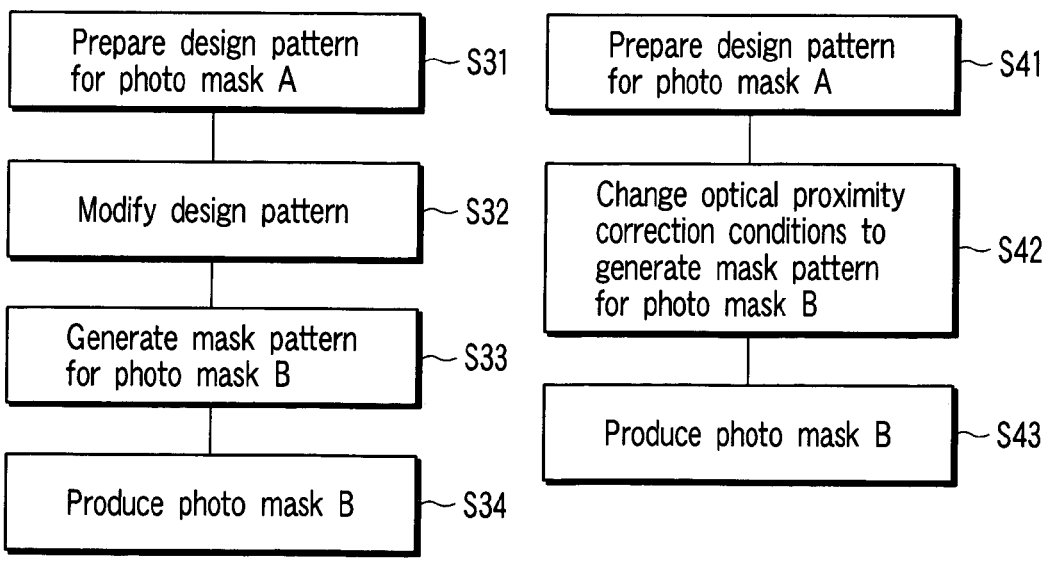
FIG. 3 is a flowchart showing an example of a method for producing a new photo mask according to the embodiment of the present invention.
FIG. 4 is a flowchart showing another example of a method for producing a new photo mask according to the embodiment of the present invention.

FIG. 3 is a flowchart showing a method of modifying the design pattern of the photo mask A to produce a photo mask B.

First, a design pattern for the photo mask A is prepared (S31). The design pattern of the photo mask A is subsequently modified. The simulation shown in FIG. 1 has already clarified the positions of the hot spots. Accordingly, areas of the design pattern (design layout) in the vicinity of the hot spots are mainly modified (S32). The modified design pattern is subsequently subjected to optical proximity correction to generate a mask pattern for a photo mask B (S33). The mask pattern generated is further formed on the photo mask to obtain a photo mask B (S34). Alternatively, after the mask pattern is generated in S33, simulation similar to that shown in FIG. 1 may be performed to determine whether or not the mask pattern generated is applicable to the exposure apparatus B.

FIG. 4 is a flowchart showing a method of modifying the mask pattern of the photo mask A to produce a photo mask B.

First, a design pattern for the photo mask A is prepared (S41). Optical proximity correction suitable for the exposure apparatus B is subsequently performed on the design pattern of the photo mask A to generate a mask pattern for the photo mask B (S42). That is, a mask pattern for the photo mask B is generated under optical proximity correction conditions different from those for the photo mask A. The optical proximity correction conditions include the illumination shape of the exposure apparatus, the lens aberration of the exposure apparatus, a PEB (Post Exposure Bake) condition for the photo resist, and a development condition for the photo resist, and an etching condition (S43). Alternatively, after the mask pattern is generated in S42, simulation similar to that shown in FIG. 1 may be performed to determine whether or not the mask pattern generated is applicable to the exposure apparatus B.

As described above, the present embodiment performs simulation using the plurality of exposure conditions to predetermine whether or not the photo mask (photo mask A) produced for one exposure apparatus (exposure apparatus A) can be used for another (exposure apparatus B). Consequently, if the exposure apparatus is changed, it is possible to appropriately determine earlier which of the two measures is to be taken, that is, whether to adjust the exposure parameter or to produce a new photo mask. This makes it possible to prevent the manufacture period from being extended.

The above embodiment uses the illumination shape as the exposure condition (exposure parameter) specified for simulation. However, another exposure parameter may be used. For example, the exposure parameter may be the aberration of optical system of the exposure apparatus, the transmittance of optical system of the exposure apparatus, or the degree of polarization of exposure light. Alternatively, these exposure parameters may be combined together to specify a plurality of exposure conditions.

The method described above in the embodiment can of course be implemented by a computer having its operation controlled by a program describing the procedure of the method. This program can be provided via a recording medium such as a magnetic disk or via a communication line (wired or radio line) such as the Internet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of determining a photo mask, comprising:
   specifying a mask pattern for a photo mask for a first exposure apparatus, the first exposure apparatus being used for illuminating a photo mask;
   specifying a plurality of exposure conditions allowed to be set for a second exposure apparatus, the second exposure apparatus being used for illuminating a photo mask and being different from the first exposure apparatus;
   predicting a projection image of the mask pattern to be projected on a substrate by the second exposure apparatus, for each of the exposure conditions;
   predicting a processed pattern to be formed on a substrate surface on the basis of the projection image, for each of the exposure conditions;
   determining whether or not the processed pattern meets a predetermined condition for each of the exposure conditions; and
   determining that the photo mask for which the first exposure apparatus is used to illuminate is applicable to the second exposure apparatus if the processed pattern meets the predetermined condition for at least one of the exposure conditions.

2. The method according to claim 1, further comprising determining that the exposure condition for which the processed pattern meets the predetermined condition is applied to the second exposure apparatus if the photo mask for which the first exposure apparatus is used to illuminate is determined to be applicable to the second exposure apparatus.

3. The method according to claim 1, wherein the mask pattern is subjected to an optical proximity correction suitable for the first exposure apparatus.

4. The method according to claim 1, wherein determining whether or not the processed pattern meets the predetermined condition includes comparing the processed pattern with a reference pattern.

5. The method according to claim 4, wherein comparing the processed pattern with the reference pattern includes determining a dimensional difference between the processed pattern and the reference pattern.

6. The method according to claim 5, wherein determining whether or not the processed pattern meets the predetermined condition includes determining the number of spots in which the dimensional difference is greater than an allowable dimensional difference.

7. The method according to claim 1, wherein the processed pattern includes a photo resist pattern.

8. The method according to claim 1, wherein the exposure conditions include at least one of an illumination shape, aberration of an optical system, transmittance of an optical system, and the degree of polarization of exposure light.

9. A method of manufacturing a semiconductor device, comprising:
   specifying a mask pattern for a photo mask for a first exposure apparatus, the first exposure apparatus being used for illuminating a photo mask;
   specifying a plurality of exposure conditions allowed to be set for a second exposure apparatus, the second exposure apparatus being used for illuminating a photo mask and being different from the first exposure apparatus;
   predicting a projection image of the mask pattern to be projected on a substrate by the second exposure apparatus, for each of the exposure conditions;
   predicting a processed pattern to be formed on a substrate surface on the basis of the projection image, for each of the exposure conditions;

determining whether or not the processed pattern meets a predetermined condition for each of the exposure conditions;

determining that the photo mask for which the first exposure apparatus is used to illuminate is applicable to the second exposure apparatus if the processed pattern meets the predetermined condition for at least one of the exposure conditions; and allowing the second exposure apparatus to project the mask pattern of the photo mask on a substrate, on the basis of the determination that the photo mask for which the first exposure apparatus is used to illuminate is applicable to the second exposure apparatus.

10. A method of manufacturing a semiconductor device, comprising:

specifying a mask pattern for a photo mask for a first exposure apparatus, the first exposure apparatus being used for illuminating a photo mask;

specifying a plurality of exposure conditions allowed to be set for a second exposure apparatus, the second exposure apparatus being used for illuminating a photo mask and being different from the first exposure apparatus;

predicting a projection image of the mask pattern to be projected on a substrate by the second exposure apparatus, for each of the exposure conditions; predicting a processed pattern to be formed on a substrate surface on the basis of the projection image, for each of the exposure conditions;

determining whether or not the processed pattern meets a predetermined condition for each of the exposure conditions;

determining that the photo mask for which the first exposure apparatus is used to illuminate is applicable to the second exposure apparatus if the processed pattern meets the predetermined condition for at least one of the exposure conditions;

determining that the photo mask is inapplicable to the second exposure apparatus if the processed pattern does not meet the predetermined condition for any of the exposure conditions;

producing a new photo mask on the basis of the determination that the photo mask is inapplicable to the second exposure apparatus; and allowing the second exposure apparatus to project a mask pattern of the new photo mask on a substrate.

11. The method according to claim 10, wherein producing the new photo mask includes modifying a design pattern for the photo mask.

12. The method according to claim 10, wherein producing the new photo mask includes modifying a mask pattern for the photo mask.

13. The method according to claim 10, wherein the mask pattern of the new photo mask is subjected to an optical proximity correction suitable for the second exposure apparatus.

14. A computer program stored on a non-transitory computer-readable medium configured to store program instructions for execution on a computer, the program instructions causing the computer to perform:

specifying a mask pattern for a photo mask for a first exposure apparatus, the first exposure apparatus being used for illuminating a photo mask;

specifying a plurality of exposure conditions allowed to be set for a second exposure apparatus, the second exposure apparatus being used for illuminating a photo mask and being different from the first exposure apparatus;

predicting a projection image of the mask pattern to be projected on a substrate by the second exposure apparatus, for each of the exposure conditions;

predicting a processed pattern to be formed on a substrate surface on the basis of the projection image, for each of the exposure conditions;

determining whether or not the processed pattern meets a predetermined condition for each of the exposure conditions; and determining that the photo mask for which the first exposure apparatus is used to illuminate is applicable to the second exposure apparatus if the processed pattern meets the predetermined condition for at least one of the exposure conditions.

* * * * *